(12) United States Patent
Goto (10) Patent No.: US 8,266,564 B2
(45) Date of Patent: Sep. 11, 2012

(54) VERIFICATION APPARATUS, VERIFICATION METHOD, AND COMPUTER-READABLE RECORDING MEDIUM FOR SUPPORTING ENGINEERING CHANGE ORDER

(75) Inventor: Atsuko Goto, Tokyo (JP)

(73) Assignee: NEC Corporation, Tokyo (JP)

(*) Notice: Subject to any disclaimer, the term of this patent is extended or adjusted under 35 U.S.C. 154(b) by 197 days.

(21) Appl. No.: 12/796,725

(22) Filed: Jun. 9, 2010

(65) Prior Publication Data

US 2010/0333053 A1 Dec. 30, 2010

(30) Foreign Application Priority Data

Jun. 26, 2009 (JP) ................................. 2009-152760

(51) Int. Cl.
*G06F 17/50* (2006.01)

(52) U.S. Cl. ........ 716/107; 716/100; 716/101; 716/102; 716/103; 716/106; 716/112; 716/132; 716/136; 716/139

(58) Field of Classification Search .......... 716/100–103, 716/106–107, 112, 132, 136, 139
See application file for complete search history.

(56) References Cited

U.S. PATENT DOCUMENTS 6,490,710 B1* 12/2002 Wada ........................... 716/107
7,543,257 B2* 6/2009 Goto ............................. 716/100
7,992,123 B2* 8/2011 Hsin ............................. 716/132
2009/0217215 A1* 8/2009 Goto ................................. 716/1

FOREIGN PATENT DOCUMENTS

| JP | 5-312905 A | 11/1993 |
| JP | 9-54787 A | 2/1997 |
| JP | 2003058597 A | 2/2003 |
| JP | 2005038357 A | 2/2005 |
| JP | 2007328646 A | 12/2007 |

OTHER PUBLICATIONS

Japanese Office Action for JP2009-152760 issued May 11, 2011.

* cited by examiner

*Primary Examiner* — Nghia Doan (57) ABSTRACT

A verification apparatus includes a reference circuit-side point extraction unit that extracts a point where the input value of a signal changes due to a logic change in a reference circuit in a state before and after the logic change, based on information regarding a signal that has changed due to the logic change in the reference circuit; a circuit to be verified-side point extraction unit that extracts a point where the input value of a signal changes due to a logic change in a circuit to be verified in a state before and after the logic change, based on information regarding a signal that has changed due to the logic change in the circuit to be verified; and a verification script generation unit that generates a verification script with use of the points extracted by the reference circuit-side point extraction unit and the circuit to be verified-side point extraction unit.

9 Claims, 10 Drawing Sheets

FIG. 1

FIG. 2A  Example of signals pertaining to a logic change in a reference circuit

Before logic change
```
        :
always @(*)
  if (S) Y=A;
  else Y=B;
        :
```

After logic change
```
        :
always @(*)
  if (S) Y=A;
  else Y=C;
        :
```

⇒ Left-hand signal Y is input to reference circuit-side point extraction unit as a signal in an instance pertaining to a logic change FIG. 2B  Example of signals pertaining to a logic change in a reference circuit Before logic change
```
        :
assign K=exec1(A,B);
assign T=exec2(A,B,C);
        :
```

After logic change
```
        :
assign K=esec3(A,B);
assign T=exec4(A,B,C);
        :
```

⇒ Left-hand signals K and T are input to reference circuit-side point extraction unit as signals in instances pertaining to a logic change FIG. 2C  Example of signals pertaining to a logic change in a reference circuit Before logic change
```
        :
SUBA INS1(.pin1(Y), .pin2(A), .pin3(B), .pin4(S),);
        :
```

After logic change
```
        :
SUBA INS1(.pin1(Y), .pin2(A), .pin3(C), .pin4(S),);
        :
```

⇒Connection net (output signal) of output pin of signal INS1 is input to reference circuit-side point extraction unit

FIG. 3A (corresponds to FIG. 2A)

FIG. 3B (corresponds to FIG. 2B)

FIG. 3C (corresponds to FIG. 2C)

Matching information

| Reference circuit | Circuit to be verified |
|---|---|
| a | a y |
| b | b y |
| c | c y |
| d | d y |
| e | e y |

FIG. 9B

Verification point list

| Reference circuit | Circuit to be verified |
|---|---|
| a | a y |
| b | c y |

FIG. 9C

Verification point merging results

| Reference circuit | Circuit to be verified |
|---|---|
| a | a y |
| b | b y |
| c | c y |

FIG. 9D

| Verification script |
|---|
| Verify Command a ay |
| Verify Command b by |
| Verify Command c cy |

FIG. 10

VERIFICATION APPARATUS, VERIFICATION METHOD, AND COMPUTER-READABLE RECORDING MEDIUM FOR SUPPORTING ENGINEERING CHANGE ORDER

CROSS-REFERENCE TO RELATED APPLICATIONS

This application is based upon and claims the benefit of priority from Japanese patent application No. 2009-152760, filed on Jun. 26, 2009, the disclosure of which is incorporated herein in its entirety by reference.

BACKGROUND OF THE INVENTION

1. Field of the Invention

The present invention relates to a verification apparatus, a verification method, and a computer-readable recording medium for executing verification of the entirety of circuits in the case where a modification has been made to a reference circuit and a circuit to be verified.

2. Background Art

In the design step for semiconductor devices such as LSIs (hereinafter, referred to as the "semiconductor design step"), the miniaturization of circuits has been accompanied by a rise in the frequency of occurrences of ECOs (Engineering Change Order: a post-design circuit modification), and thus the importance of ECOs has increased. For example, in an ECO, a logic circuit described in the RTL (Register Transfer Level) and a netlist are modified by changing the logic thereof so as to be suitable to each other.

Since modifications are made manually in ECOs, there is a strong possibility that the designer will make an erroneous modification, and there are cases in which identifying whether an error has been made is time-consuming. Accordingly, if an error has been made, the modification error needs to be modified as well, thus lengthening the TAT (Turn Around Time).

In view of this, JP 2007-328646A (hereinafter, referred to as "Patent Document 1") discloses technology in which, in the ECO execution step, portions in a modified HDL (Hardware Description Language) description that are different from the pre-modification logic circuit are hierarchized, and furthermore a new logic circuit is created by performing logic synthesis on the hierarchized portions, and the created logic circuit is used to replace the corresponding portion of the pre-modification logic circuit. According to the technology disclosed in Patent Document 1, the hierarchization of the differing portions enables reducing the size of the executable unit of the logic synthesis, thereby shortening the time required for again executing and confirming logic synthesis and logic equivalence verification. This consequently suppresses a lengthening of the TAT.

However, in the technology disclosed in Patent Document 1, there is the problem (the first problem) that it is not possible to deal with a case where the netlist has been manually modified due to a wiring delay, constraints in terms of the arrangement of elements, or the like. Also, in conventional ECOs, it has been necessary to execute verification for the entirety of a chip when the netlist has been manually modified, even if the pre-modification netlist and the post-modification netlist differ by only a few lines. Accordingly, there is the problem (the second problem) that designing is time-consuming, and designing cannot be made more efficient.

To solve the second problem, it is conceivable to, for example, reduce the verification range by designating a verification point with use of a verification tool. However, if such a technique is employed, another problem (the third problem) arises in that a verification omission occurs if the netlist includes a connection of which the designer is not aware.

As another example, JP H9-54787A (hereinafter, referred to as "Patent Document 2") discloses technology in which, if a circuit parameter has been modified, portions that are influenced by the circuit parameter modification are extracted from the entirety of the circuit, and circuit simulation is executed for only the extracted portions.

According to the technology disclosed in Patent Document 2, it is possible to deal with a manual modification to the netlist as well, and thus the first problem is solved. Also, with the technology disclosed in Patent Document 2, simulation is performed only for a specified circuit, and thus the second problem is also solved. Furthermore, the portions influenced by a circuit parameter modification are automatically extracted, and therefore there is no leeway for the third problem to occur in the technology disclosed in Patent Document 2.

However, with the technology disclosed in Patent Document 2, verification is performed only for the extracted portions, and not for the entirety of the post-modification circuit, and therefore there is the problem that such technology cannot deal with a case where verification of the entirety of a circuit is necessary. For this reason, there is demand for the development of technology that shortens the design time and increases efficiency while verifying the entirety of circuits.

SUMMARY OF THE INVENTION

An exemplary object of the present invention is to solve the above problems and provide a verification apparatus, a verification method, and a computer-readable recording medium for shortening the design time and increasing efficiency while verifying the entirety of circuits in the case where a modification has been made to a verified reference circuit and circuit to be verified.

In order to achieve the above object, a verification apparatus according to an exemplary aspect of the present invention is a verification apparatus for verifying a circuit to be verified in a case where a logic change has been made to a reference circuit and the circuit to be verified that has been created from the reference circuit in a semiconductor design step, including: a reference circuit-side point extraction unit that extracts, from the reference circuit in a state before the logic change and in a state after the logic change, a point where an input value of a signal changes due to the logic change, based on information regarding a signal that has changed due to the logic change in the reference circuit; a circuit to be verified-side point extraction unit that extracts, from the circuit to be verified in a state before the logic change and in a state after the logic change, a point where an input value of a signal changes due to the logic change, based on information regarding a signal that has changed due to the logic change in the circuit to be verified; and a verification script generation unit that generates a verification script for verifying the circuit to be verified, with use of the point extracted by the reference circuit-side point extraction unit and the point extracted by the circuit to be verified-side point extraction unit.

Also, in order to achieve the above object, a verification method according to an exemplary aspect of the present invention is a verification method for verifying a circuit to be verified in a case where a logic change has been made to a reference circuit and the circuit to be verified that has been created from the reference circuit in a semiconductor design step, including the steps of: (a) extracting, from the reference circuit in a state before the logic change and in a state after the logic change, a point where an input value of a signal changes due to the logic change, based on information regarding a signal that has changed due to the logic change in the reference circuit; (b) extracting, from the circuit to be verified in a state before the logic change and in a state after the logic change, a point where an input value of a signal changes due to the logic change, based on information regarding a signal that has changed due to the logic change in the circuit to be verified; and (c) generating a verification script for verifying the circuit to be verified, with use of the point extracted in the step (a) and the point extracted in the step (b).

Furthermore, in order to achieve the above object, a computer-readable recording medium according to an exemplary aspect of the present invention is a computer-readable recording medium having recorded thereon a program for, with use of a computer, verifying a circuit to be verified in a case where a logic change has been made to a reference circuit and the circuit to be verified that has been created from the reference circuit in a semiconductor design step, the program including instructions for causing the computer to execute the steps of (a) extracting, from the reference circuit in a state before the logic change and in a state after the logic change, a point where an input value of a signal changes due to the logic change, based on information regarding a signal that has changed due to the logic change in the reference circuit; (b) extracting, from the circuit to be verified in a state before the logic change and in a state after the logic change, a point where an input value of a signal changes due to the logic change, based on information regarding a signal that has changed due to the logic change in the circuit to be verified; and (c) generating a verification script for verifying the circuit to be verified, with use of the point extracted in the step (a) and the point extracted in the step (b).

According to the features described above, the verification apparatus, verification method, and program of the present invention enable shortening the design time and increasing efficiency while verifying the entirety of circuits in the case where a modification has been made to a verified reference circuit and circuit to be verified.

BRIEF DESCRIPTION OF THE DRAWINGS

FIGS. 7A and 7B are diagrams for illustrating determination processing in steps A7 and A8 of FIG. 5 and steps B7 and B8 of FIG. 6, where FIG. 7A shows a circuit in a state before a logic change, and FIG. 7B shows the circuit in a state after the logic change.

FIGS. 8A and 8B are diagrams for illustrating determination processing in steps A7 and A8 of FIG. 5 and steps B7 and B8 of FIG. 6, where FIG. 8A shows a circuit in a state before a logic change, and FIG. 8B shows the circuit in a state after the logic change.

EXEMPLARY EMBODIMENT

Figure 1:
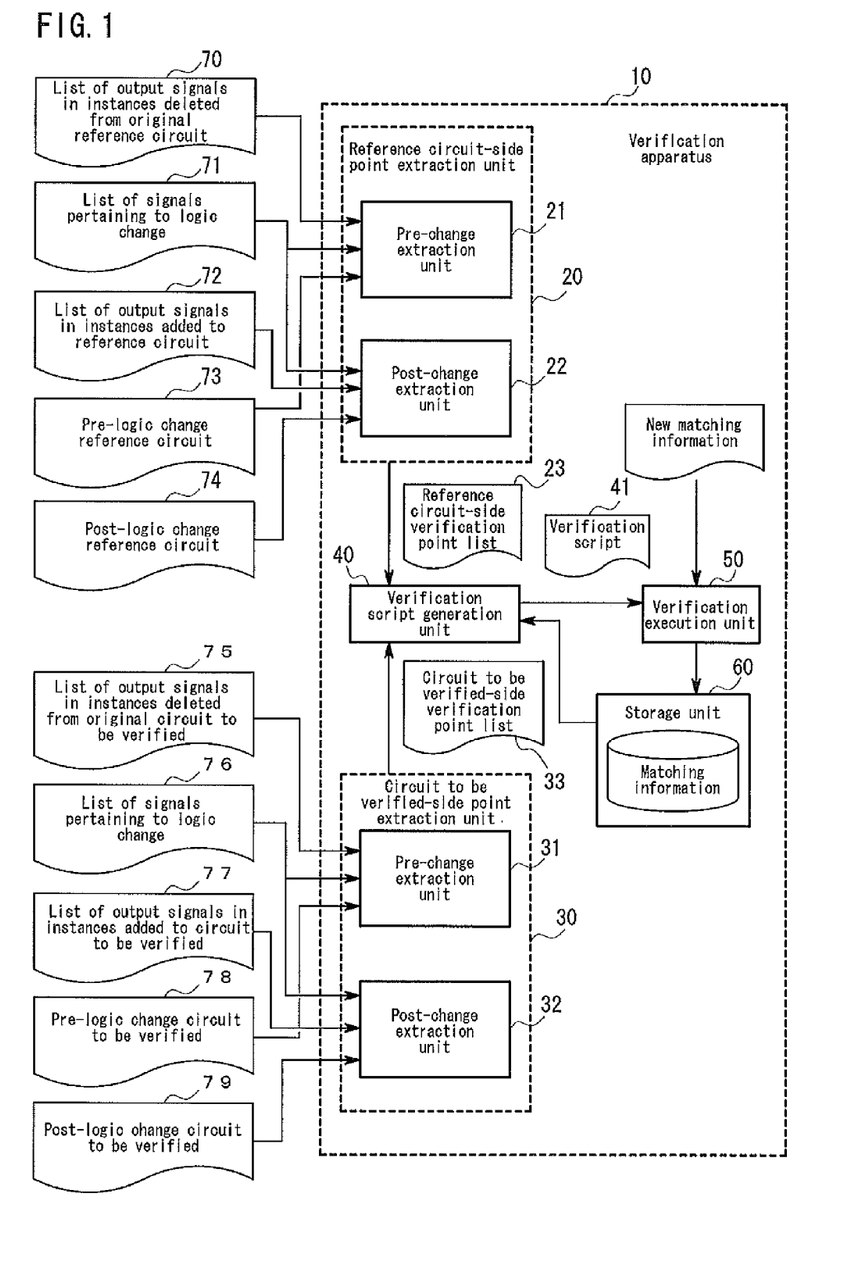
FIG. 1 is a block diagram showing a schematic configuration of a verification apparatus according to an exemplary embodiment of the present invention.

Below is a description of a verification apparatus, a verification method, and a program in an exemplary embodiment of the present invention with reference to FIGS. 1 to 9. First, a description is given of the configuration of the verification apparatus in the exemplary embodiment of the present invention with reference to FIG. 1. FIG. 1 is a block diagram showing a schematic configuration of the verification apparatus according to the exemplary embodiment of the present invention.

A verification apparatus 10 in the present exemplary embodiment shown in FIG. 1 is an apparatus for verifying a circuit to be verified, in the case where a logic change has been made to a reference circuit and the circuit to be verified that has been created from the reference circuit in the semiconductor design step (LSI design step). In the present exemplary embodiment, a logic circuit described in the Register Transfer Level (RTL) using a hardware description language (HDL) is used as an example of the reference circuit. Also, a netlist obtained by performing logic synthesis on the logic circuit described in the HDL is used as an example of the circuit to be verified.

As shown in FIG. 1, the verification apparatus 10 includes a reference circuit-side point extraction unit 20, a circuit to be verified-side point extraction unit 30, and a verification script generation unit 40. Based on information regarding signals that have changed due to a logic change in the reference circuit, the above reference circuit-side point extraction unit 20 extracts, from the pre-logic change reference circuit and the post-logic change reference circuit, points (verification points) where the input value of a signal changes due to the logic change. The reference circuit-side point extraction unit 20 also creates a list 23 including the extracted verification points, and inputs the list 23 to the verification script generation unit 40.

Based on information regarding signals that have changed due to a logic change in the circuit to be verified, the circuit to be verified-side point extraction unit 30 extracts, from the pre-logic change circuit to be verified and the post-logic change circuit to be verified, points (verification points) where the input value of a signal changes due to the logic change. The circuit to be verified-side point extraction unit 30 also creates a list 33 including the extracted verification points, and inputs the list 33 to the verification script generation unit 40.

The verification script generation unit 40 generates a verification script 41 for verifying the circuit to be verified, with use of the verification points extracted by the reference circuit-side point extraction unit 20 and the verification points extracted by the circuit to be verified-side point extraction unit 30. The verification script generation unit 40 also inputs the generated verification script 41 to a verification execution unit 50 that is described later.

In this way, in the verification apparatus 10, if the reference circuit and the circuit to be verified are modified by a logic change, points (verification points) where the input value of a signal changes due to the logic change are extracted from both the reference circuit and the circuit to be verified. Then, a verification script in which the verification range has been set to an appropriate range is created using the extracted verification points, thus enabling shortening the TAT. Also, since the verification points extracted from the circuits have been extracted from the entirety of each circuit based on the information regarding signals in the circuits that have changed due to the logic change, the entirety of each circuit is verified by executing the generated verification script. Accordingly, the verification apparatus 10 enables shortening the design time and increasing efficiency while verifying the entirety of circuits.

Figure 2A:
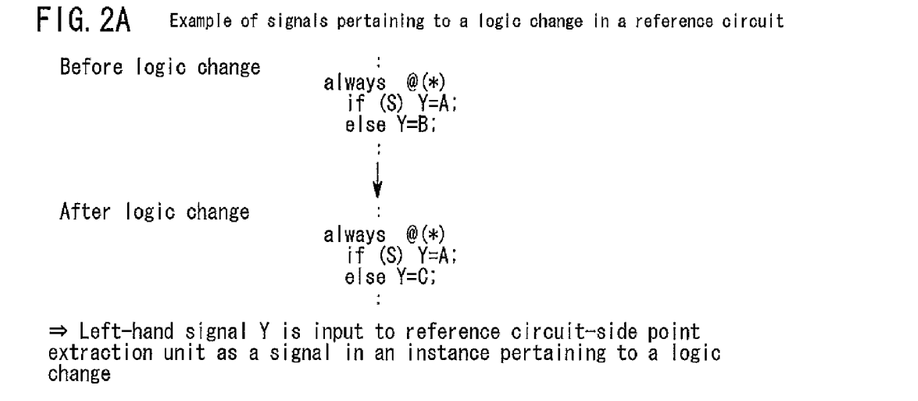
FIGS. 2A to 2C are diagrams each showing an example of a reference circuit used in the exemplary embodiment of the present invention.
Figure 2B:
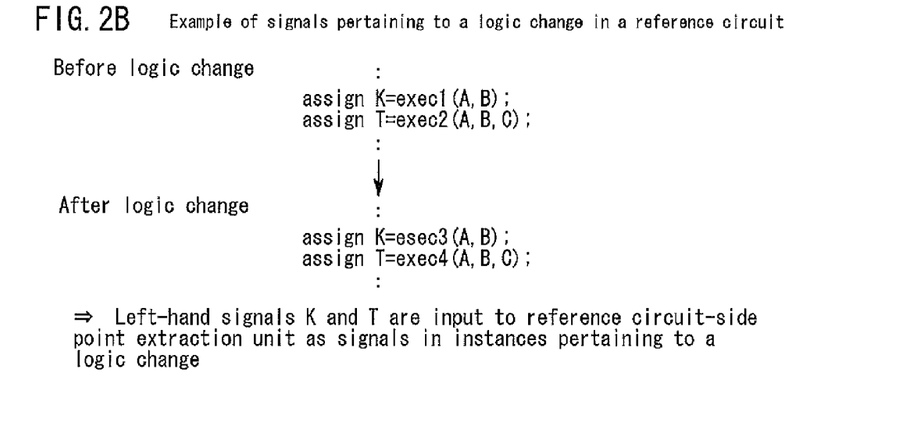
Figure 2C:
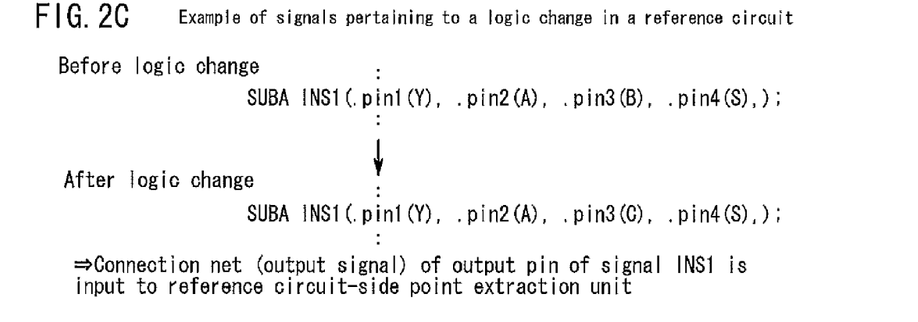
Figure 3A:
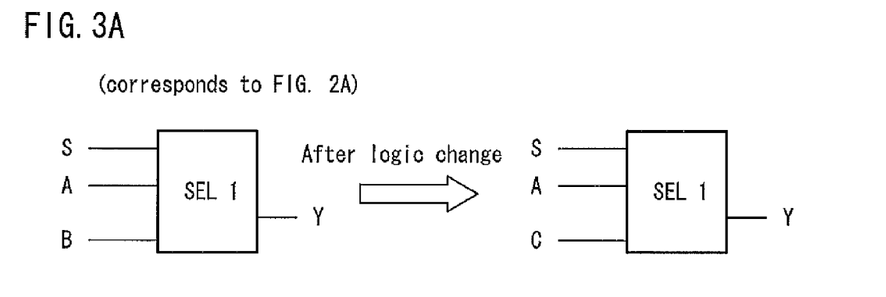
FIGS. 3A to 3C are diagrams each showing an example of a circuit to be verified that is used in the exemplary embodiment of the present invention.
Figure 3B:
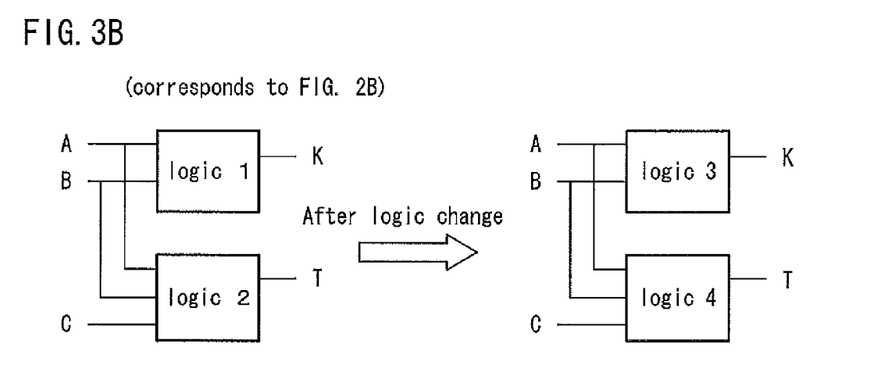
Figure 3C:
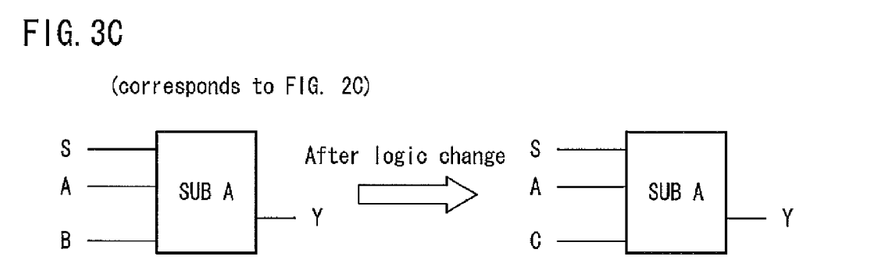

Below is a more detailed description of the configuration of the verification apparatus 10 in the present exemplary embodiment with reference to FIGS. 2A to 2C and 3A to 3C. FIGS. 2A to 2C are diagrams each showing an example of a reference circuit used in the exemplary embodiment of the present invention. FIGS. 3A to 3C are diagrams each showing an example of a circuit to be verified that is used in the exemplary embodiment of the present invention.

In the present exemplary embodiment, the reference circuit-side point extraction unit 20 receives an input of lists 70 to 72 as shown in FIG. 1. The reference circuit-side point extraction unit 20 acquires the lists 70 to 72 as information regarding signals that have changed due to a logic change in a pre-logic change reference circuit. The reference circuit-side point extraction unit 20 also receives an input of a pre-logic change reference circuit 73 and a post-logic change reference circuit 74.

The list 71 is a list of signals that have changed due to a logic change in the reference circuit. Examples of the signals included in the list 71 include "signal Y" shown in FIG. 2A and "signals K and T" shown in FIG. 2B, which are signals in an instance for which a logic change has been made. Another example is "pin3" shown in FIG. 2C, which is an output signal of an output pin whose connection destination has changed.

Also, the list 70 is a list of signals included in an instance that has been deleted from the reference circuit due to a logic change. Examples of the signals included in the list 70 include an output signal of a logical expression that has been deleted after a logic change, and an output signal of an output pin that has been deleted. Specific examples include "signal B" shown in FIG. 2A, "signal A", "signal B", and "signal C" shown in FIG. 2B, and "signal B" shown in FIG. 2C.

Furthermore, the list 72 is a list of signals included in an instance that has been added to the reference circuit due to a logic change. Examples of the signals included in the list 72 include an output signal of a logical expression that has been added after a logic change, and an output signal of an output pin that has been added. Specific examples include "signal C" shown in FIG. 2A, "signal A", "signal B", and "signal C" shown in FIG. 2B, and "signal C" shown in FIG. 2C.

Also, in the present exemplary embodiment, the circuit to be verified-side point extraction unit 30 receives an input of lists 75 to 77 as shown in FIG. 1. The circuit to be verified-side point extraction unit 30 acquires the lists 75 to 77 as information regarding signals that have changed to a logic change in a circuit to be verified. The circuit to be verified-side point extraction unit 30 also receives an input of a pre-logic change circuit to be verified 78 and a post-logic change circuit to be verified 79.

The list 76 is a list of signals that have changed due to a logic change in the circuit to be verified. Examples of the signals included in the list 76 include "signal Y" shown in FIG. 3A and "signals K and T" shown in FIG. 3B, which are signals in an instance for which a logic change has been made. Another example is "pin3" shown in FIG. 3C, which is an output signal of an output pin whose connection destination has changed. Note that FIGS. 3A, 3B, and 3C respectively correspond to FIGS. 2A, 2B, and 2C.

Also, the list 75 is a list of signals included in an instance that has been deleted from the circuit to be verified due to a logic change, similarly to the list 70 described above. Specific examples include "signal B" shown in FIG. 3A, "signal A", "signal B", and "signal C" shown in FIG. 3B, and "signal B" shown in FIG. 3C.

Furthermore, the list 77 is a list of signals included in an instance that has been added to the circuit to be verified due to a logic change, similarly to the list 72 described above. Specific examples include "signal C" shown in FIG. 3A, "signal A", "signal B", and "signal C" shown in FIG. 3B, and "signal C" shown in FIG. 3C.

Also, in the present exemplary embodiment, the reference circuit-side point extraction unit 20 includes a pre-change extraction unit 21 and a post-change extraction unit 22. The pre-change extraction unit 21 extracts verification points from the pre-logic change reference circuit 73 with use of the lists 70 and 71.

Specifically, the pre-change extraction unit 21 specifies, in the pre-logic change reference circuit 73, routes of signals that are included in the lists 70 and 71, and furthermore specifies registers or external output terminals that exist on the specified routes. Then, if a specified register or a specified external output terminal exists in both the pre-logic change reference circuit and the post-logic change reference circuit, the pre-change extraction unit 21 extracts the specified register or specified external output terminal as a verification point. Note that the registers and external output terminals specified in this way are sometimes referred to as "compare points" in the description hereinafter.

Also, the post-change extraction unit 22 extracts verification points from the post-logic change reference circuit 74 with use of the lists 71 and 72. Specifically, the post-change extraction unit 22 specifies, in the post-logic change reference circuit 74, routes of signals that are included in the lists 71 and 72, and furthermore specifies registers or external output terminals (compare points) that exist on the specified routes. Then, if a specified register or a specified external output terminal exists in both the pre-logic change reference circuit and the post-logic change reference circuit, the post-change extraction unit 22 extracts the specified register or specified external output terminal as a verification point.

When the extraction processing performed by the pre-change extraction unit 21 and the post-change extraction unit 22 has ended, the reference circuit-side point extraction unit 20 outputs the verification points extracted by the pre-change extraction unit 21 and the verification points extracted by the post-change extraction unit 22 to the verification script generation unit 40. In FIG. 1, reference numeral 23 indicates a list including the verification points extracted by the pre-change extraction unit 21 and the verification points extracted by the post-change extraction unit 22.

Furthermore, in the present exemplary embodiment, the circuit to be verified-side point extraction unit 30 also includes a pre-change extraction unit 31 and a post-change extraction unit 32, similarly to the reference circuit-side point extraction unit 20. The pre-change extraction unit 31 extracts verification points from the pre-logic change circuit to be verified 78 with use of the lists 75 and 76. Here, the pre-change extraction unit 31 executes extraction processing using the same process as the above-described process used by the pre-change extraction unit 21, with the exception of using the circuit to be verified as the target of extraction.

Specifically, the pre-change extraction unit 31 specifies, in the pre-logic change circuit to be verified 78, routes of signals that are included in the lists 75 and 76, and furthermore specifies registers or external output terminals (compare points) that exist on the specified routes. Then, if a specified register or a specified external output terminal exists in both the pre-logic change circuit to be verified and the post-logic change circuit to be verified, the pre-change extraction unit 31 extracts the specified register or specified external output terminal as a verification point.

Also, the post-change extraction unit 32 extracts verification points from the post-logic change circuit to be verified 79 with use of the lists 76 and 77. Here, the post-change extraction unit 32 executes extraction processing using the same process as the above-described process used by the post-change extraction unit 22, with the exception of using the circuit to be verified as the target of extraction.

Specifically, the post-change extraction unit 32 specifies, in the post-logic change circuit to be verified 79, routes of signals that are included in the lists 76 and 77, and furthermore specifies registers or external output terminals (compare points) that exist on the specified routes. Then, if a specified register or a specified external output terminal exists in both the pre-logic change circuit to be verified and the post-logic change circuit to be verified, the post-change extraction unit 32 extracts the specified register or specified external output terminal as a verification point.

When the extraction processing performed by the pre-change extraction unit 31 and the post-change extraction unit 32 has ended, the circuit to be verified-side point extraction unit 30 outputs the verification points extracted by the pre-change extraction unit 31 and the verification points extracted by the post-change extraction unit 32 to the verification script generation unit 40. In FIG. 1, reference numeral 33 indicates a list including the verification points extracted by the pre-change extraction unit 31 and the verification points extracted by the post-change extraction unit 32.

Also, in the present exemplary embodiment, the verification apparatus 10 includes a verification execution unit 50 and a storage unit 60 in addition to the reference circuit-side point extraction unit 20, the circuit to be verified-side point extraction unit 30, and the verification script generation unit 40.

The storage unit 60 stores matching information. Matching information is information including the correspondence relationship between the registers and external output terminals included in the reference circuit and the registers and external output terminals included in the circuit to be verified. In other words, the matching information specifies the correspondence relationship between compare points that can possibly be detected as verification points in the reference circuit and compare points that can possibly be detected as verification points in the circuit to be verified.

In the present exemplary embodiment, the verification script generation unit 40 compares the verification points in the reference circuit and the verification points in the circuit to be verified, based on the correspondence relationship specified by the matching information. Note that the verification points in the reference circuit are specified by the list 23, and the verification points in the circuit to be verified are specified by the list 33.

Also, if the result of the comparison is that a verification point in either the reference circuit or the circuit to be verified does not correspond to any of the verification points in the other circuit, the verification script generation unit 40 adds the corresponding register or external output terminal included in the other circuit, as a verification point in the other circuit. Then, the verification script generation unit 40 generates a verification script for evaluating equivalence between the verification points in the reference circuit (including added verification points) and the corresponding verification points in the circuit to be verified (including added verification points).

The verification execution unit 50 executes the generated verification script, and verifies the circuit to be verified. Specifically, the verification script describes instructions which instruct the determination of equivalence between two verification points that have been designated. The verification execution unit 50 is configured so as to be able to use a verification tool that is conventionally used in semiconductor designing, and executes the instructions described in the verification script, and determines equivalence between the two verification points that have been designated.

Also, in the present exemplary embodiment, if a register or an external output terminal has been newly added to the reference circuit or the circuit to be verified due to a logic change, the verification execution unit 50 receives an input of matching information that includes the register or external output terminal that has been added. In this case, the verification execution unit 50 updates the matching information stored in the storage unit 60.

Figure 4:
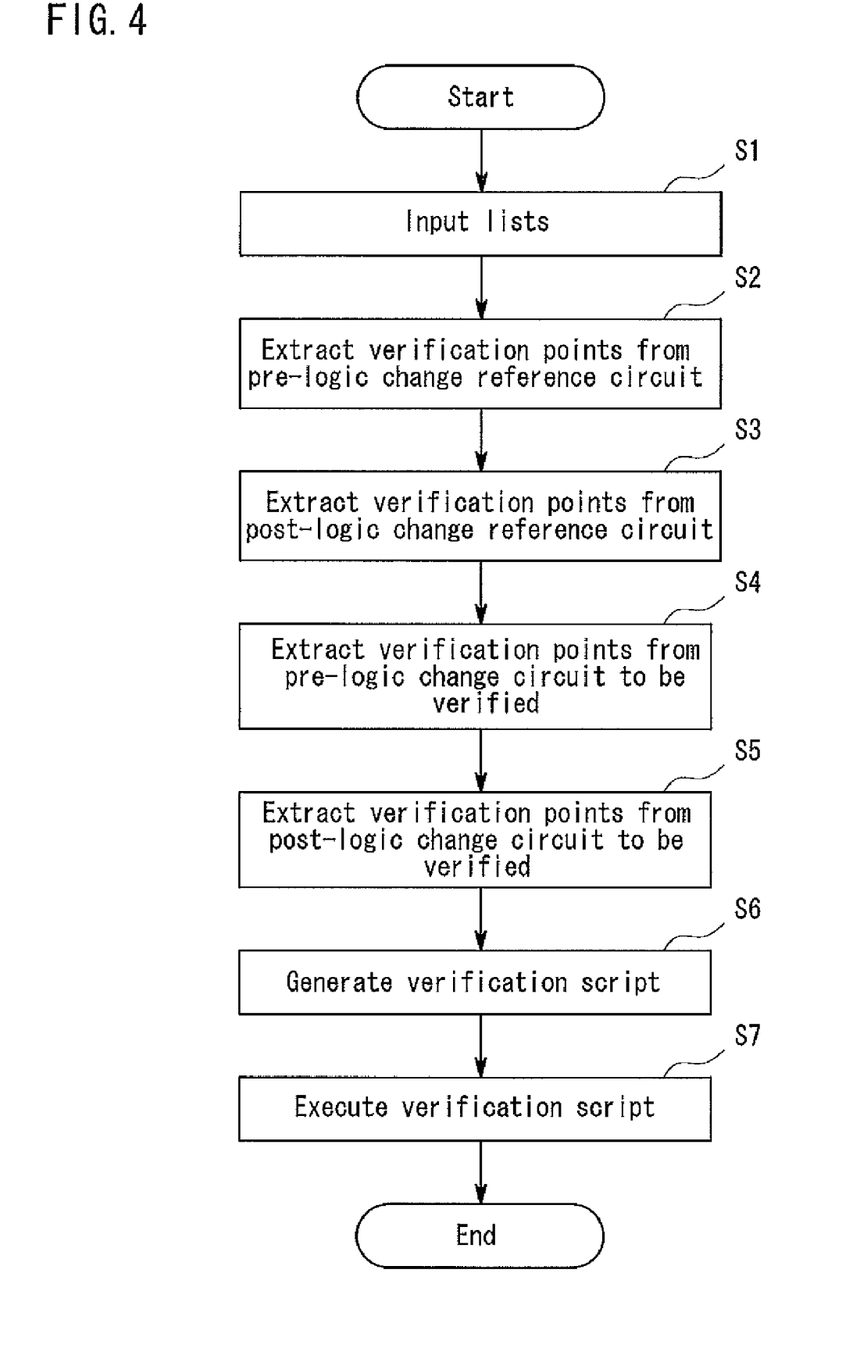
FIG. 4 is a flowchart showing overall operations of the verification apparatus according to the exemplary embodiment of the present invention.

Next is a description of operations performed by the verification apparatus 10 in this exemplary embodiment of the present invention with reference to FIGS. 4 to 9. First, a description of overall operations performed by the verification apparatus 10 is given. FIG. 4 is a flowchart showing overall operations of the verification apparatus according to the exemplary embodiment of the present invention. The verification method in the present exemplary embodiment is implemented by causing the verification apparatus 10 to operate. For this reason, the below description of the operations performed by the verification apparatus 10 is given in place of a description of the verification method in the present exemplary embodiment. Reference should be made to FIGS. 1 to 3 where appropriate in the below description.

As shown in FIG. 4, first the reference circuit-side point extraction unit 20 receives an input of the lists 70 to 72, and the circuit to be verified-side point extraction unit 30 receives an input of the lists 75 to 77 (step S1). In step S1, the reference circuit-side point extraction unit 20 also receives an input of the pre-logic change reference circuit 73 and the post-logic change reference circuit 74. Furthermore, the circuit to be verified-side point extraction unit 30 also receives an input of the pre-logic change circuit to be verified 78 and the post-logic change circuit to be verified 79.

Next, in the reference circuit-side point extraction unit 20, the pre-change extraction unit 21 extracts verification points from the pre-logic change reference circuit 73 with use of the lists 70 and 71 (step S2). Also, the post-change extraction unit 22 extracts verification points from the post-logic change reference circuit 74 with use of the lists 71 and 72 (step S3).

Next, in the circuit to be verified-side point extraction unit 30, the pre-change extraction unit 31 extracts verification points from the pre-logic change circuit to be verified 78 with use of the lists 75 and 76 (step S4). Also, the post-change extraction unit 32 extracts verification points from the post-logic change circuit to be verified 79 with use of the lists 76 and 77 (step S5).

Also, the verification points extracted by the pre-change extraction unit 21 in step S2 and the verification points extracted by the post-change extraction unit 22 in step S3 are output to the verification script generation unit 40. Similarly, the verification points extracted by the pre-change extraction unit 31 in step S4 and the verification points extracted by the post-change extraction unit 32 in step S5 are also output to the verification script generation unit 40. Note that the execution sequence of steps S2 to S5 is not limited to this. Also, steps S2, S3, S4, and S5 may be executed at the same time.

Next, the verification script generation unit 40 refers to the matching information and generates the verification script 41 with use of the verification points of the reference circuit that were extracted in steps S2 and S3, and the verification points of the circuit to be verified that were extracted in steps S4 and S5 (step S6).

Thereafter, the verification execution unit 50 executes the verification script created in step S6, and verifies the circuit to be verified (step S7). Specifically, the verification script describes instructions which instruct the determination of equivalence between two verification points that have been designated. In step S7, equivalence between the two verification points that have been designated is determined. The result of step S7 is externally output, and processing in the verification apparatus 10 ends.

Figure 5:
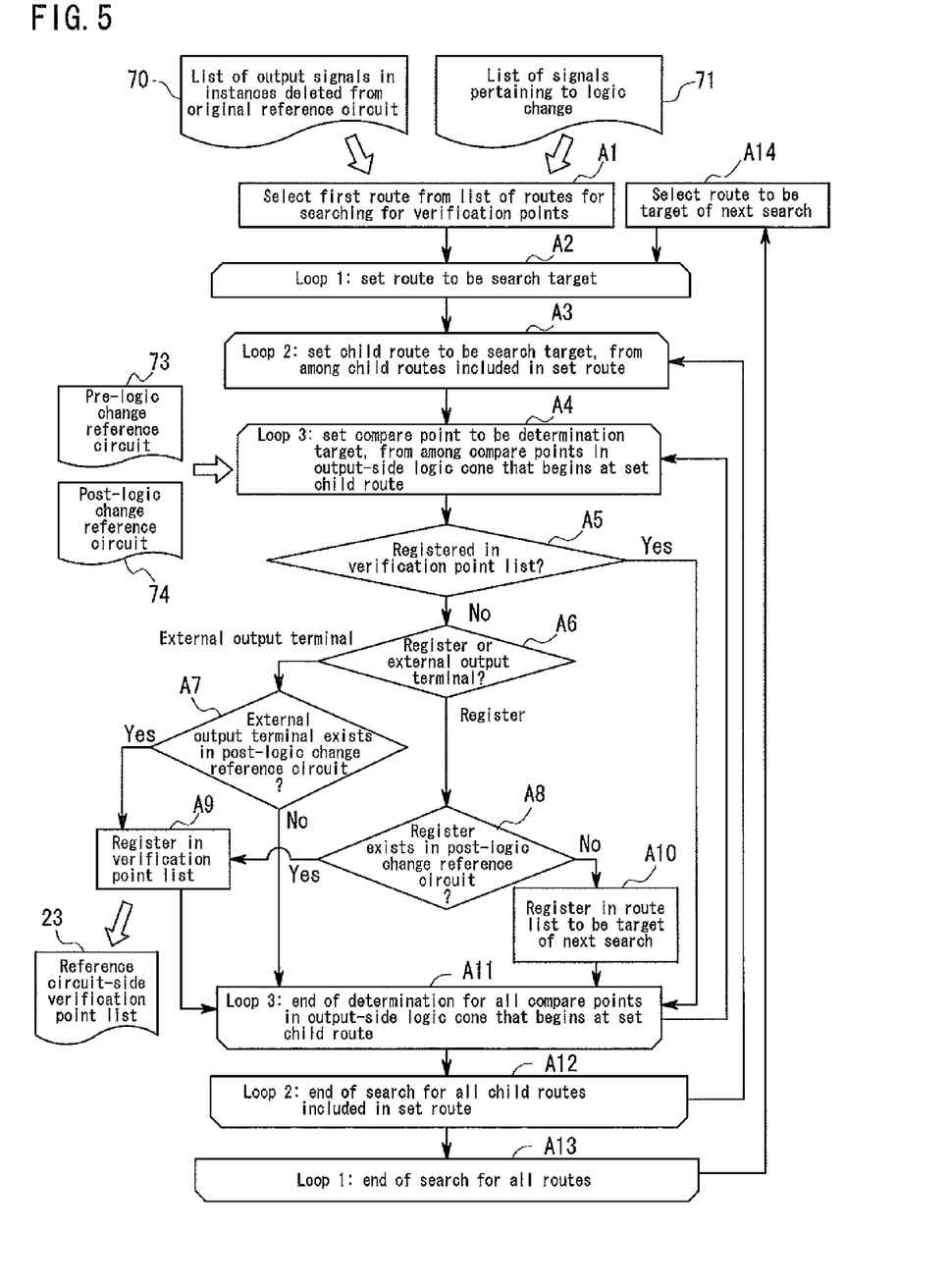
FIG. 5 is a flowchart showing details of step S2 in FIG. 4.
Figure 6:
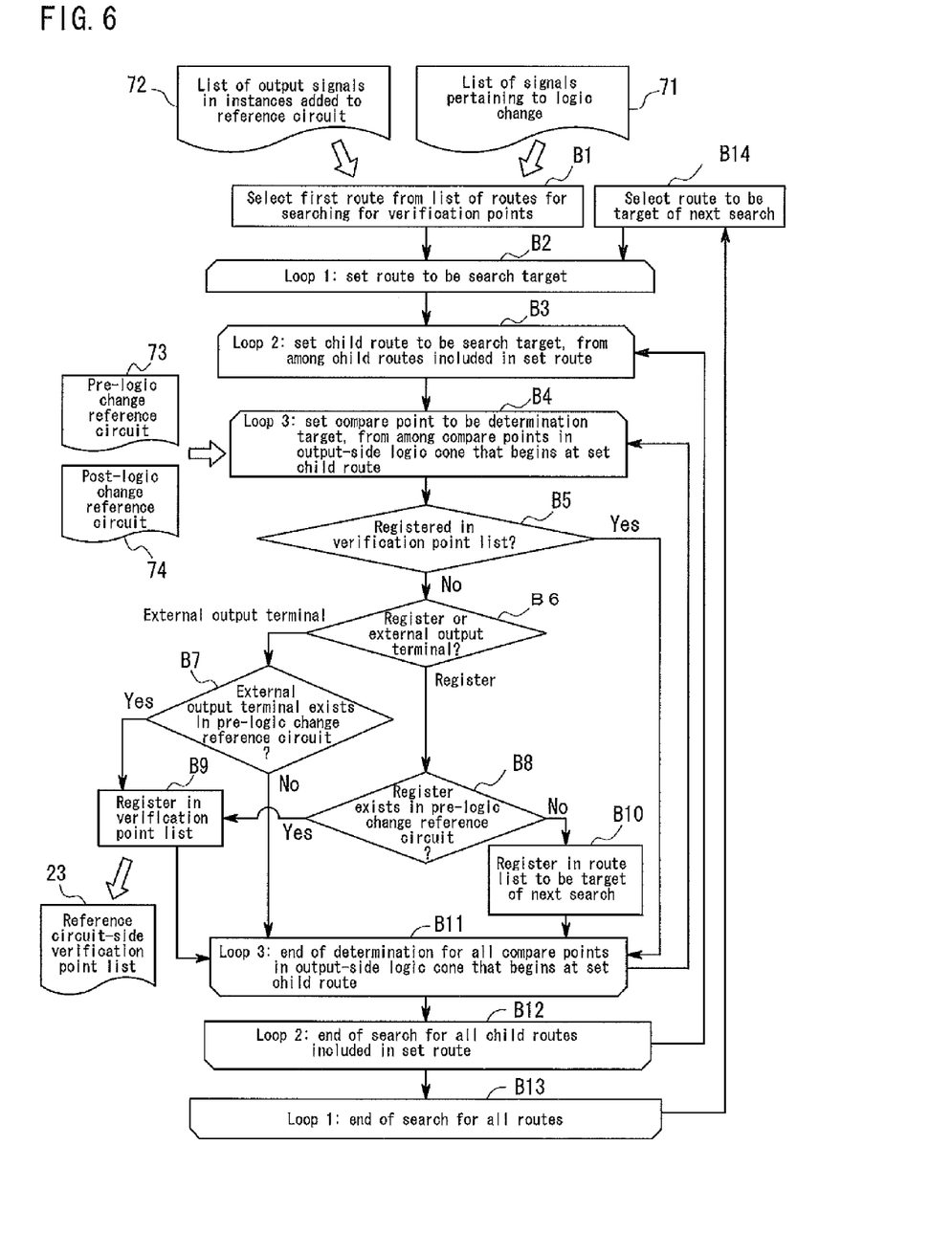
FIG. 6 is a flowchart showing details of step S3 in FIG. 4.
Figure 7A:
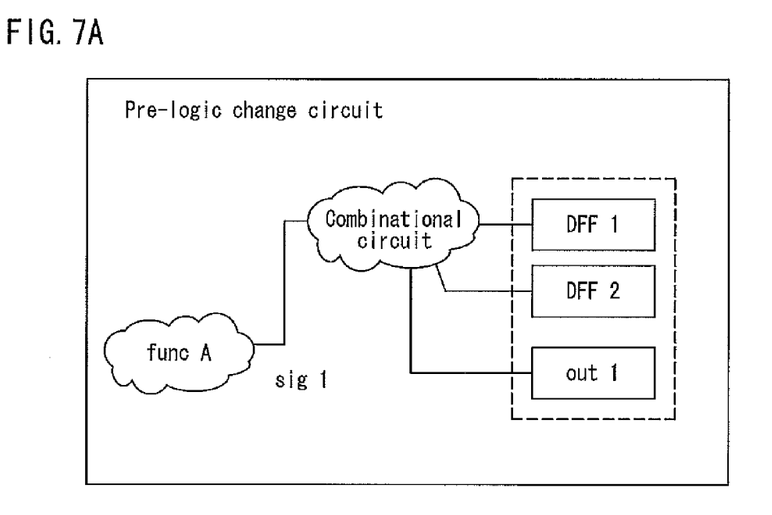
Figure 7B:
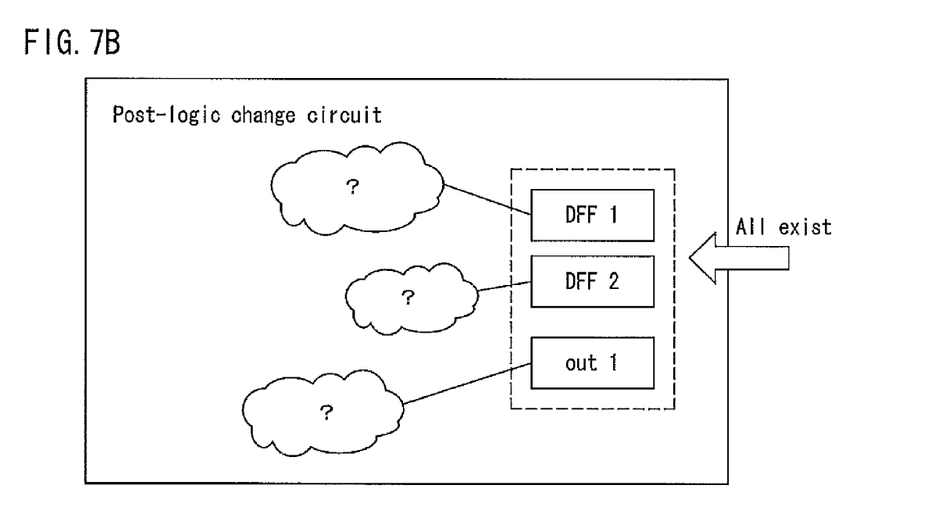
Figure 8A:
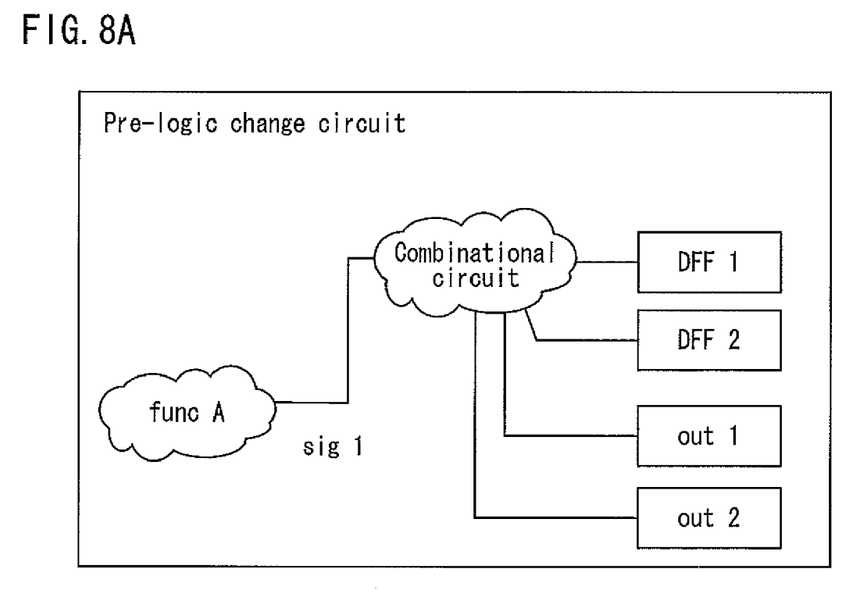
Figure 8B:
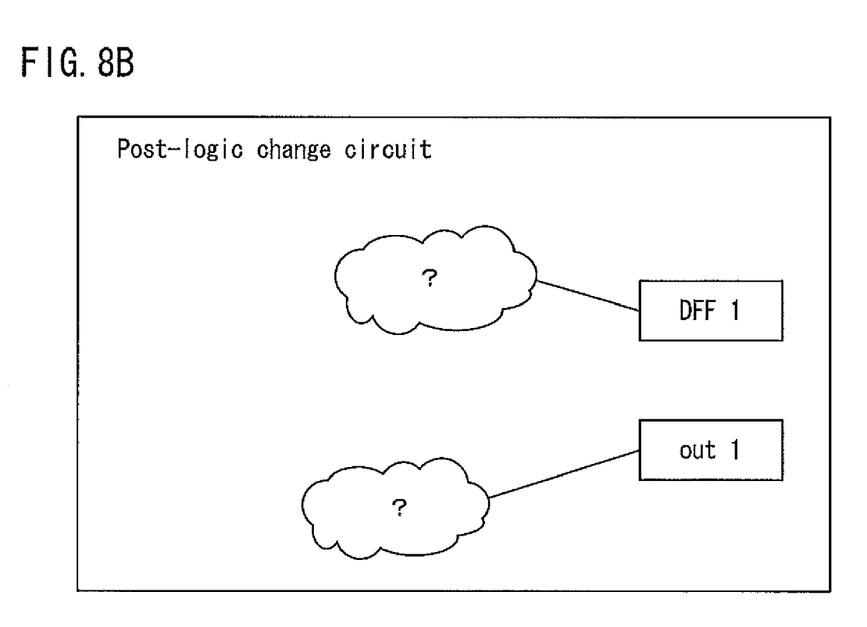

The following is a detailed description of the above-described steps S2 and S3 with reference to FIGS. 5 to 8. FIG. 5 is a flowchart showing details of step S2 in FIG. 4. FIG. 6 is a flowchart showing details of step S3 in FIG. 4. FIGS. 7 and 8 are diagrams for illustrating determination processing in steps A7 and A8 of FIG. 5 and steps B7 and B8 of FIG. 6, where FIGS. 7A and 8A show a circuit in a state before a logic change, and FIGS. 7B and 8B show the circuit in a state after the logic change.

First is a description of step S2 with reference to FIG. 5. First, the pre-change extraction unit 21 specifies signals included in the lists 70 and 71, and creates a list of routes (a route list) for extracting (searching for) verification points. Then, as shown in FIG. 5, the pre-change extraction unit 21 selects the first route from the route list for searching for verification points (step A1).

Next, the pre-change extraction unit 21 sets the route to be the search target (step A2), and subsequently sets, from among routes (hereinafter, referred to as "child routes") included in the set route, a child route to be the search target (step A3).

Next, the pre-change extraction unit 21 specifies an output-side logic cone that begins at the set child route, traces back through the specified logic cone to a register or an external output terminal, and extracts the compare points included in the specified logic cone. Then, the pre-change extraction unit 21 sets one of the compare points included in the specified logic cone as the target of the determination performed in steps A5 to A8 (step A4).

Next, the pre-change extraction unit 21 determines whether the compare point set in step A4 is registered in the list (verification list) 23 including verification points on the reference circuit side (step A5). If the compare point is registered, the pre-change extraction unit 21 executes step A11, and if the compare point is not registered, the pre-change extraction unit 21 determines whether the compare point set in step A4 is a register or an external output terminal (step A6).

If the result of the determination performed in step A6 is that the compare point set in step A4 is an external output terminal, the pre-change extraction unit 21 determines whether the external output terminal exists in the post-logic change reference circuit (step A7).

If the result of the determination performed in step A7 is that the external output terminal exists in the post-logic change reference circuit as well as shown in FIGS. 7A and 7B, the pre-change extraction unit 21 registers the compare point set in step A4 in the verification list 23 (step A9), and thereafter executes step A11.

On the other hand, if the result of the determination performed in step A7 is that the external output terminal does not exist in the post-logic change reference circuit as shown in FIGS. 8A and 8B (e.g., if the external output terminal is "out2" in FIG. 8A), the pre-change extraction unit 21 executes step A11. In this case, the compare point set in step A4 is not registered in the verification list 23.

Also, if the result of the determination performed in step A6 is that the compare point set in step A4 is a register, the pre-change extraction unit 21 determines whether the register exists in the post-logic change reference circuit (step A8).

If the result of the determination performed in step A8 is that the register exists in the post-logic change reference circuit as well as shown in FIGS. 7A and 7B, the pre-change extraction unit 21 executes step A9 and registers the compare point set in step A4 in the verification list 23.

On the other hand, if the result of the determination performed in step A8 is that the register does not exist in the post-logic change reference circuit as shown in FIGS. 8A and 8B (e.g., if the register is "DFF2" in FIG. 8A), the pre-change extraction unit 21 executes step A10.

In step A10, instead of registering the compare point set in step A4 in the verification list 23, the pre-change extraction unit 21 registers the compare point in a route list to be the target of the next search, which is different from the route list described above. Note that "the route list to be the target of the next search" refers to a route list used in a different logic change performed after the logic change that was the cause of the execution of steps A1 to A14.

Next, in step A11, the pre-change extraction unit 21 determines whether steps A5 to A10 have ended for all the compare points included in the logic cone specified in step A4. The pre-change extraction unit 21 executes steps A5 to A10 again if the result of the determination is that these steps have not ended for all the compare points, and executes step A12 if the result is that these steps have ended for all the compare points.

Next, in step A12, the pre-change extraction unit 21 determines whether the verification point search for all the child routes included in the route set in step A2 (steps A4 to A11) has ended. The pre-change extraction unit 21 executes steps A4 to A11 again if the result of the determination is that the verification point search has not ended for all the child routes, and executes step A13 if the result is that the verification point search has ended for all the child routes.

Next, in step A13, the pre-change extraction unit 21 determines whether the verification point search for all the routes included in the route list (steps A3 to A12) has ended. If the result of the determination is that the verification point search has not ended for all the routes, the pre-change extraction unit 21 selects a route to be the target of the next search (step A14), and thereafter again executes steps A3 to A12. On the other hand, if the verification point search has ended for all the routes, the pre-change extraction unit 21 ends this processing. Thus, step S2 shown in FIG. 4 ends.

In this way, according to the execution of steps A1 to A14, the pre-change extraction unit 21 specifies, from among compare points in the pre-logic change circuit, compare points at which an input value has possibly changed due to a logic change, and extracts the specified compare points as verification points.

Next is a description of step S3 with reference to FIG. 6. First, the post-change extraction unit 22 specifies signals included in the lists 71 and 72, and creates a list of routes (a route list) for extracting (searching for) verification points, in the same way as the pre-change extraction unit 21. Then, as shown in FIG. 6, the post-change extraction unit 22 selects the first route from the list for searching for verification points (step B1).

Next, the post-change extraction unit 22 sets the route to be the search target (step B2), and subsequently sets, from among routes (hereinafter, referred to as "child routes") included in the set route, a child route to be the search target (step B3).

Next, the post-change extraction unit 22 specifies an output-side logic cone that begins at the set child route, traces back through the specified logic cone to a register or an external output terminal, and extracts the compare points included in the specified logic cone. Then, the post-change extraction unit 22 sets one of the compare points included in the specified logic cone as the target of the determination performed in steps B5 to B8 (step B4).

Next, the post-change extraction unit 22 determines whether the compare point set in step B4 is registered in the list (verification list) 23 including verification points on the reference circuit side (step B5). If the compare point is registered, the post-change extraction unit 22 executes step B11, and if the compare point is not registered, the post-change extraction unit 22 determines whether the compare point set in step B4 is a register or an external output terminal (step B6).

If the result of the determination performed in step B6 is that the compare point set in step B4 is an external output terminal, the post-change extraction unit 22 determines whether the external output terminal exists in the pre-logic change reference circuit (step B7).

If the result of the determination performed in step B7 is that the external output terminal exists in the pre-logic change reference circuit as well as shown in FIGS. 7A and 7B, the post-change extraction unit 22 registers the compare point set in step B4 in the verification list 23 (step B9), and thereafter executes step B11.

On the other hand, if the result of the determination performed in step B7 is that the external output terminal does not exist in the pre-logic change reference circuit, the post-change extraction unit 22 executes step B11. In this case, the compare point set in step B4 is not registered in the verification list 23.

If the result of the determination performed in step B6 is that the compare point set in step B4 is a register, the post-change extraction unit 22 determines whether the register exists in the pre-logic change reference circuit (step B8).

If the result of the determination performed in step B8 is that the register exists in the pre-logic change reference circuit as well as shown in FIGS. 7A and 7B, the post-change extraction unit 22 executes step B9 and registers the compare point set in step B4 in the verification list 23.

On the other hand, if the result of the determination performed in step B8 is that the register does not exist in the pre-logic change reference circuit, the post-change extraction unit 22 executes step B10.

In step B10, instead of registering the compare point set in step B4 in the verification list 23, the post-change extraction unit 22 registers the compare point in a route list to be the target of the next search, which is different from the route list described above, in the same way as in the above-described step A10.

Next, in step B11, the post-change extraction unit 22 determines whether steps B5 to B10 have ended for all the compare points included in the logic cone specified in step B4. The post-change extraction unit 22 executes steps B5 to B10 again if the result of the determination is that these steps have not ended for all the compare points, and executes step B12 if the result is that these steps have ended for all the compare points.

Next, in step B12, the post-change extraction unit 22 determines whether the verification point search for all the child routes included in the route set in step B2 (steps B4 to B11) has ended. The post-change extraction unit 22 executes steps B4 to B11 again if the result of the determination is that the verification point search has not ended for all the child routes, and executes step B13 if the result is that the verification point search has ended for all the child routes.

Next, in step B13, the post-change extraction unit 22 determines whether the verification point search for all the routes included in the route list (steps B3 to B12) has ended. If the result of the determination is that the verification point search has not ended for all the routes, the post-change extraction unit 22 selects a route to be the target of the next search (step B14), and thereafter again executes steps B3 to B12. On the other hand, if the verification point search has ended for all the routes, the post-change extraction unit 22 ends this processing. Thus, step S3 shown in FIG. 4 ends.

In this way, according to the execution of steps B1 to B14, the post-change extraction unit 22 specifies, from among compare points in the post-logic change circuit, compare points at which an input value has possibly changed due to a logic change, and extracts the specified compare points as verification points.

Also, in step S4 shown in FIG. 4, the pre-change extraction unit 31 of the circuit to be verified-side point extraction unit 30 executes processing conforming to steps A1 to A14 shown in FIG. 5. Note that in this case, a route list is created from the lists 75 and 76. Furthermore, the processing conforming to steps A1 to A14 is performed using the pre-logic change circuit to be verified as the target.

Moreover, in step S5 shown in FIG. 4, the post-change extraction unit 32 of the circuit to be verified-side point extraction unit 30 executes processing conforming to steps B1 to B14 shown in FIG. 6. Note that in this case, a route list is created from the lists 76 and 77. Also, the processing conforming to steps B1 to B14 is performed using the post-logic change circuit to be verified as the target.

Figure 9A:
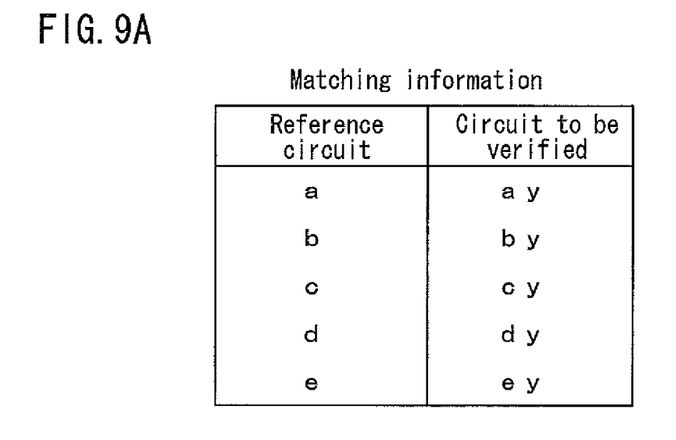
FIG. 9A is a diagram showing an example of matching information.
Figure 9B:
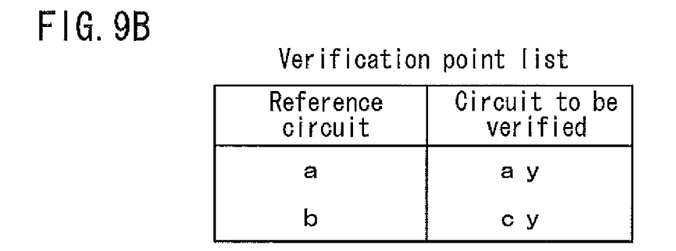
FIG. 9B is a diagram showing an example of a verification point list.
Figure 9C:
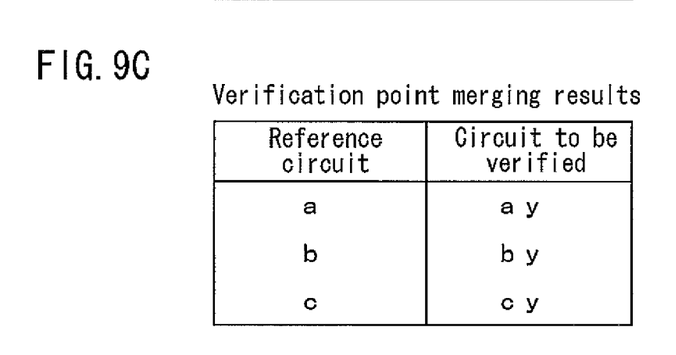
FIG. 9C is a diagram showing an example of verification point merging results.
Figure 9D:
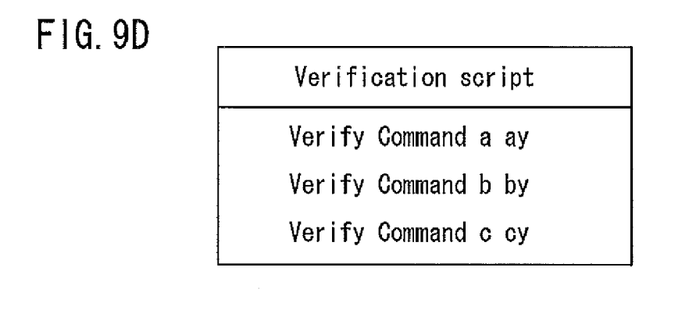
FIG. 9D is a diagram showing an example of a verification script.

Next is a description of the processing performed in step S6 with reference to the examples shown in FIGS. 9A to 9D. FIG. 9A is a diagram showing an example of matching information. FIG. 9B is a diagram showing an example of a verification point list. FIG. 9C is a diagram showing an example of verification point merging results. FIG. 9D is a diagram showing an example of a verification script.

As can be seen in the matching information shown in FIG. 9A, in the present example, compare points a, b, c, d, and e of the reference circuit respectively correspond to compare points ay, by, cy, dy, and ey of the circuit to be verified. In the present example, as shown in FIG. 9B, the reference circuit-side point extraction unit 20 detects the compare points a and b as detection points. Also, as shown in FIG. 9B, the circuit to be verified-side point extraction unit 30 detects the compare points ay and cy as detection points.

The verification script generation unit 40 merges the verification points shown in FIG. 9B with use of the matching information shown in FIG. 9A, and generates the verification script shown in FIG. 9D. Specifically, first the verification script generation unit 40 compares the verification points in the reference circuit and the verification points in the circuit to be verified. As a result, in the example shown in FIG. 9B, the verification script generation unit 40 determines that the verification point b in the reference circuit does not correspond to any of the verification points in the circuit to be verified, and that the verification point cy in the circuit to be verified does not correspond to any of the verification points in the reference circuit.

Next, the verification script generation unit 40 adds the compare point by corresponding to the verification point b in the reference circuit as a verification point in the circuit to be verified, and adds the compare point c corresponding to the verification point cy in the circuit to be verified as a verification point in the reference circuit. The result obtained by this merge processing is shown in FIG. 9C.

Next, the verification script generation unit 40 generates a verification script for evaluating equivalence between the verification points a, b, and c in the reference circuit and the corresponding verification points ay, by, and cy in the circuit to be verified. Here, assuming that, for example, the command for evaluating equivalence between a compare point $1 of the reference circuit and a compare point $2 of the circuit to be verified is "Verify Command $1 $2", the verification script is as shown in FIG. 9D.

When the verification script shown in FIG. 9D is executed by the verification execution unit 50, equivalence between the verification points a, b, and c in the reference circuit and the corresponding verification points ay, by, and cy in the circuit to be verified is evaluated, and the result is output from the verification execution unit 50.

It is sufficient that the program of the present exemplary embodiment is a program for causing a computer to execute steps S1 to S7 shown in FIG. 4, steps A1 to A14 shown in FIG. 5, and steps B1 to B14 shown in FIG. 6. Also, the verification apparatus 10 and the verification method of the present exemplary embodiment can be realized by installing and executing this program in the computer.

In this case, a CPU (Central Processing Unit) of the computer functions as the reference circuit-side point extraction unit 20, the circuit to be verified-side point extraction unit 30, the verification script generation unit 40, and the verification execution unit 50, and performs processing. Also, the storage unit 60 is realized by a storage apparatus such as a hard disk or memory included in the computer.

Figure 10:
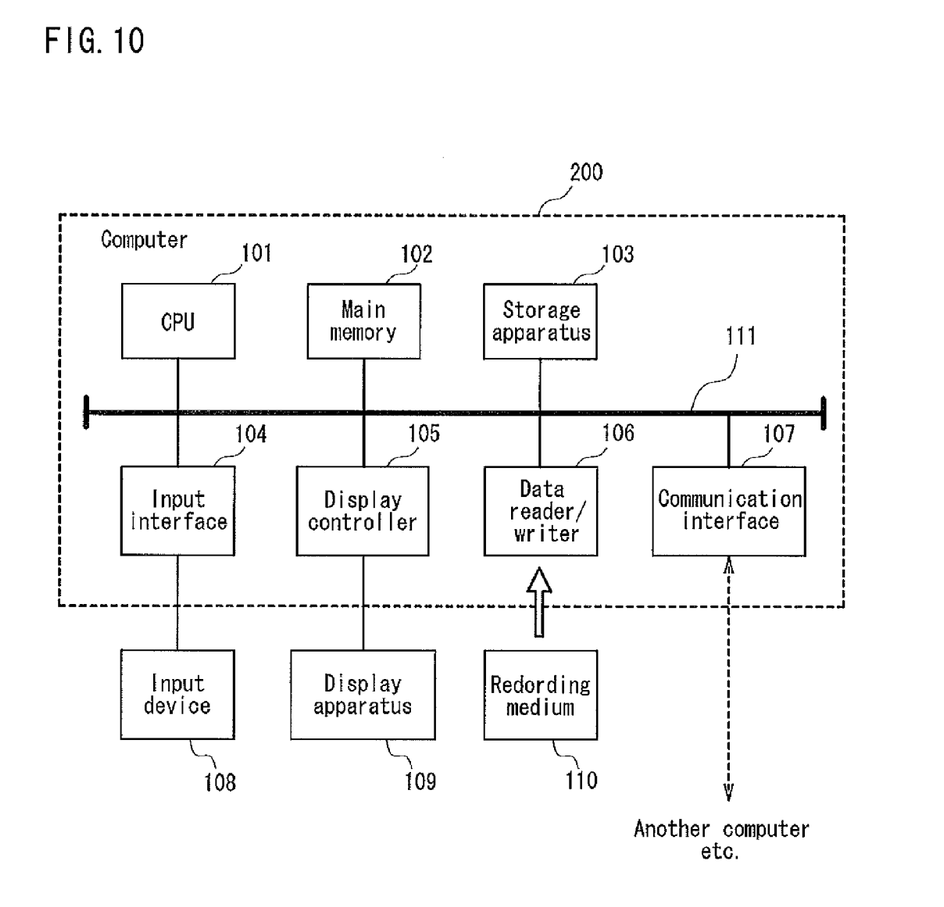
FIG. 10 is a block diagram showing an example of a computer that realizes the verification apparatus according to the exemplary embodiment of the present invention.

The following describes the computer that realizes the verification apparatus 10 by executing the program of the present exemplary embodiment, with reference to FIG. 10. FIG. 10 is a block diagram showing an example of the computer that realizes the verification apparatus of the exemplary embodiment of the present invention.

As shown in FIG. 10, a computer 200 includes a CPU 101, a main memory 102, a storage apparatus 103, an input interface 104, a display controller 105, a data reader/writer 106, and a communication interface 107. These units are connected via a bus 111 so as to enable data communication therebetween.

The CPU 101 expands the program (code) of the present exemplary embodiment that is stored in the storage apparatus 103 to the main memory 102, and implements various types of calculations by executing the code in a predetermined sequence. The main memory 102 is typically a volatile storage apparatus such as a DRAM (Dynamic Random Access Memory). Also, the program of the present exemplary embodiment is provided stored on a recording medium 110.

Note that the program of the present exemplary embodiment may be distributed over the Internet, which is connected to via the communication interface 107. In addition to a hard disk, specific examples of the storage apparatus 103 include a semiconductor storage apparatus such as a flash memory.

Also, the input interface 104 mediates data exchanges between the CPU 101 and an input device 108 such as a keyboard or a mouse. The display controller 105 is connected to a display apparatus 109, and controls the display of the display apparatus 109. The data reader/writer 106 mediates data exchanges between the CPU 101 and the recording medium 110, reads programs from the recording medium 110, and writes the results of processing performed in the computer 200 to the recording medium 110. The communication interface 107 mediates data exchanges between the CPU 101 and other computers.

Note that specific examples of the recording medium 110 include general-purpose semiconductor storage devices such as a CF (Compact Flash) card and an SD (Secure Digital) card, a magnetic storage medium such as a Flexible Disk, and an optical storage medium such as a CD-ROM (Compact Disk Read Only Memory).

In this way, according to the verification apparatus 10 of the present exemplary embodiment, verification points are extracted from the entirety of both a reference circuit and a circuit to be verified. Then, due to a verification script generated from the extracted verification points, it is possible to verify only portions that have been influenced by a logic change with use of a verification tool, thus enabling shortening the time required for verification. As a result, verification of the entirety of circuits, shortening of the design time, and an increase in efficiency are achieved at the same time.

In this way, the present invention enables shortening the design time and increasing efficiency while verifying the entirety of circuits in the case where a modification has been made to a reference circuit and circuit to be verified. The present invention is useful in semiconductor design (LSI design).

While the invention has been particularly shown and described with reference to an exemplary embodiment thereof, the invention is not limited to this embodiment. It will be understood by those of ordinary skill in the art that various changes in form and details may be made therein without departing from the spirit and scope of the present invention as defined by the claims.

What is claimed is:

1. A verification apparatus for verifying a circuit to be verified in a case where a logic change has been made to a reference circuit and the circuit to be verified that has been created from the reference circuit in a semiconductor design step, comprising:

a reference circuit-side point extraction unit that extracts, from the reference circuit in a state before the logic change and in a state after the logic change, a point where an input value of a signal changes due to the logic change, based on information regarding a signal that has changed due to the logic change in the reference circuit;

a circuit to be verified-side point extraction unit that extracts, from the circuit to be verified in a state before the logic change and in a state after the logic change, a point where an input value of a signal changes due to the logic change, based on information regarding a signal that has changed due to the logic change in the circuit to be verified; and a verification script generation unit that generates a verification script for verifying the circuit to be verified, with use of the point extracted by the reference circuit-side point extraction unit and the point extracted by the circuit to be verified-side point extraction unit, wherein the reference circuit-side point extraction unit acquires, as the information regarding the signal that has changed due to the logic change in the reference circuit, information that specifies a signal that has changed due to the logic change in the reference circuit, a signal included in an instance that has been deleted from the reference circuit due to the logic change, and a signal included in an instance that has been added to the reference circuit due to the logic change, and the circuit to be verified-side point extraction unit acquires, as the information regarding the signal that has changed due to the logic change in the circuit to be verified, information that specifies a signal that has changed due to the logic change in the circuit to be verified, a signal included in an instance that has been deleted from the circuit to be verified due to the logic change, and a signal included in an instance that has been added to the circuit to be verified due to the logic change, wherein the reference circuit-side point extraction unit specifies a register or an external output terminal that exists on a route for each signal specified by the information acquired by the reference circuit-side point extraction unit, and extracts the specified register or the specified external output terminal as the point in the reference circuit if the specified register or the specified external output terminal exists in the reference circuit in both the state before the logic change and the state after the logic change, and the circuit to be verified-side point extraction unit specifies a register or an external output terminal that exists on a route for each signal specified by the information acquired by the circuit to be verified-side point extraction unit, and extracts the specified register or the specified external output terminal as the point in the circuit to be verified if the specified register or the specified external output terminal exists in the circuit to be verified in both the state before the logic change and the state after the logic change.

2. The verification apparatus according to claim 1, wherein the verification script generation unit compares the point in the reference circuit and the point in the circuit to be verified based on a correspondence relationship between registers and external output terminals included in the reference circuit and registers and external output terminals included in the circuit to be verified, if a result of the comparison is that the point in one of the reference circuit and the circuit to be verified does not correspond to the point in the other one of the reference circuit and the circuit to be verified, the verification script generation unit adds the register or the external output terminal in the other one of the reference circuit and the circuit to be verified, corresponding to the point in the one of the reference circuit and the circuit to be verified, as a point in the other one of the reference circuit and the circuit to be verified, and the verification script generation unit generates the verification script that is for evaluating equivalence between each point in the reference circuit and each corresponding point in the circuit to be verified.

3. The verification apparatus according to claim 1, wherein the reference circuit is a logic circuit in a register transfer level described in a hardware description language, and the circuit to be verified is a netlist.

4. A verification method for verifying a circuit to be verified in a case where a logic change has been made to a reference circuit and the circuit to be verified that has been created from the reference circuit in a semiconductor design step, comprising the steps of:

(a) extracting, by a computer, from the reference circuit in a state before the logic change and in a state after the logic change, a point where an input value of a signal changes due to the logic change, based on information regarding a signal that has changed due to the logic change in the reference circuit;

(b) extracting, by the computer, from the circuit to be verified in a state before the logic change and in a state after the logic change, a point where an input value of a signal changes due to the logic change, based on information regarding a signal that has changed due to the logic change in the circuit to be verified; and (c) generating, by the computer a verification script for verifying the circuit to be verified, with use of the point extracted in the step (a) and the point extracted in the step (b), wherein in the step (a), information that specifies a signal that has changed due to the logic change in the reference circuit, a signal included in an instance that has been deleted from the reference circuit due to the logic change, and a signal included in an instance that has been added to the reference circuit due to the logic change, is acquired as the information regarding the signal that has changed due to the logic change in the reference circuit, and in the step (b) information that specifies a signal that has changed due to the logic change in the circuit to be verified, a signal included in an instance that has been deleted from the circuit to be verified due to the logic change, and a signal included in an instance that has been added to the circuit to be verified due to the logic change, is acquired as the information regarding the signal that has changed due to the logic change in the circuit to be verified, wherein in the step (a), a register or an external output terminal that exists on a route for each signal specified by the information acquired in the step (a) is specified, and the specified register or the specified external output terminal is extracted as the point in the reference circuit if the specified register or the specified external output terminal exists in the reference circuit in both the state before the logic change and the state after the logic change, and in the step (b), a register or an external output terminal that exists on a route for each signal specified by the information acquired in the step (b) is specified, and the specified register or the specified external output terminal is extracted as the point in the circuit to be verified if the specified register or the specified external output terminal exists in the circuit to be verified in both the state before the logic change and the state after the logic change.

5. The verification method according to claim 4, wherein in the step (c), the point in the reference circuit and the point in the circuit to be verified are compared based on a correspondence relationship between registers and external output terminals included in the reference circuit and registers and external output terminals included in the circuit to be verified, if a result of the comparison is that the point in one of the reference circuit and the circuit to be verified does not correspond to the point in the other one of the reference circuit and the circuit to be verified, the register or the external output terminal in the other one of the reference circuit and the circuit to be verified, corresponding to the point in the one of the reference circuit and the circuit to be verified, is added as a point in the other one of the reference circuit and the circuit to be verified, and the verification script that is for evaluating equivalence between each point in the reference circuit and each corresponding point in the circuit to be verified is generated.

6. The verification method according to claim 4, wherein the reference circuit is a logic circuit in a register transfer level described in a hardware description language, and the circuit to be verified is a netlist.

7. A computer-readable recording medium having recorded thereon a program for, with use of a computer, verifying a circuit to be verified in a case where a logic change has been made to a reference circuit and the circuit to be verified that has been created from the reference circuit in a semiconductor design step, the program including instructions for causing the computer to execute the steps of:

(a) extracting, from the reference circuit in a state before the logic change and in a state after the logic change, a point where an input value of a signal changes due to the logic change, based on information regarding a signal that has changed due to the logic change in the reference circuit;

(b) extracting, from the circuit to be verified in a state before the logic change and in a state after the logic change, a point where an input value of a signal changes due to the logic change, based on information regarding a signal that has changed due to the logic change in the circuit to be verified; and (c) generating a verification script for verifying the circuit to be verified, with use of the point extracted in the step (a) and the point extracted in the step (b), wherein in the step (a), information that specifies a signal that has changed due to the logic change in the reference circuit, a signal included in an instance that has been deleted from the reference circuit due to the logic change, and a signal included in an instance that has been added to the reference circuit due to the logic change, is acquired as the information regarding the signal that has changed due to the logic change in the reference circuit, and in the step b information that specifies a signal that has changed due to the logic change in the circuit to be verified, a signal included in an instance that has been deleted from the circuit to be verified due to the logic change, and a signal included in an instance that has been added to the circuit to be verified due to the logic change, is acquired as the information regarding the signal that has changed due to the logic change in the circuit to be verified, wherein in the step (a), a register or an external output terminal that exists on a route for each signal specified by the information acquired in the step (a) is specified, and the specified register or the specified external output terminal is extracted as the point in the reference circuit if the specified register or the specified external output terminal exists in the reference circuit in both the state before the logic change and the state after the logic change, and in the step (b), a register or an external output terminal that exists on a route for each signal specified by the information acquired in the step (b) is specified, and the specified register or the specified external output terminal is extracted as the point in the circuit to be verified if the specified register or the specified external output terminal exists in the circuit to be verified in both the state before the logic change and the state after the logic change.

8. The non-transitory computer-readable recording medium according to claim 7, wherein in the step (c), the point in the reference circuit and the point in the circuit to be verified are compared based on a correspondence relationship between registers and external output terminals included in the reference circuit and registers and external output terminals included in the circuit to be verified, if a result of the comparison is that the point in one of the reference circuit and the circuit to be verified does not correspond to the point in the other one of the reference circuit and the circuit to be verified, the register or the external output terminal in the other one of the reference circuit and the circuit to be verified, corresponding to the point in the one of the reference circuit and the circuit to be verified, is added as a point in the other one of the reference circuit and the circuit to be verified, and the verification script that is for evaluating equivalence between each point in the reference circuit and each corresponding point in the circuit to be verified is generated.

9. The non-transitory computer-readable recording medium according to claim 7, wherein the reference circuit is a logic circuit in a register transfer level described in a hardware description language, and the circuit to be verified is a netlist.

* * * * *